United States Patent
Wang

(10) Patent No.: US 10,034,415 B2
(45) Date of Patent: Jul. 24, 2018

(54) WATER COOLING DEVICE

(71) Applicant: JINGWAY TECHNOLOGY CO., LTD., Yun Lin County (TW)

(72) Inventor: Feng-Chang Wang, Yun Lin County (TW)

(73) Assignee: JINGWAY TECHNOLOGY CO., LTD., Yun Lin County (TW)

( * ) Notice: Subject to any disclaimer, the term of this patent is extended or adjusted under 35 U.S.C. 154(b) by 0 days.

(21) Appl. No.: 15/392,745

(22) Filed: Dec. 28, 2016

(65) Prior Publication Data

US 2018/0184549 A1   Jun. 28, 2018

(51) Int. Cl.
*B60Q 1/00* (2006.01)
*H05K 7/20* (2006.01)
(Continued)

(52) U.S. Cl.
CPC ......... *H05K 7/20763* (2013.01); *F28F 27/00* (2013.01); *F28F 27/02* (2013.01);
(Continued)

(58) Field of Classification Search
CPC .. A47G 19/027; A47G 19/2288; A47G 19/02; A47J 2202/00; A47J 27/21041; A47J 27/2105; A47J 27/21083; A47J 31/4417; A47J 31/4425; A47J 31/4457; A47J 36/2416; A47J 36/2466; A47J 36/2472; A47J 36/2494; A47J 36/32; A47J 39/025; A47J 41/0044; A47J 41/0094; A47J 41/0005; A47J 41/005; F25B 21/04; F25B 2400/24; F25B 21/02; F25B 29/00; F25B 2600/07; F25D 2331/808; F25D 2400/36; F25D 2700/16; A01D 34/006; A01D 34/64; A01D 34/82; A01D 69/00; B60K 2350/407; B60K 2350/941; B60K 2350/943; B60K 37/02; B62D 1/16; F02D 2200/50; F02D 2200/604; F02D 29/00; F02D 31/007; F02D 41/2422; G05D 23/121; G05D 23/1919; Y10T 74/20834; F01P 11/14; F01P 11/16; F01P 11/18; F01P 2025/04; F01P 2025/08; F01P 2025/32; F01P 2025/70; F01P 2031/22; B60W 10/06; B60W 10/30; B60W 20/00; B60W 10/08;
(Continued)

(56) References Cited

U.S. PATENT DOCUMENTS

| | | | | |
|---|---|---|---|---|
| 5,656,771 A | * | 8/1997 | Beswick | F01P 11/14 340/449 |
| 5,678,410 A | * | 10/1997 | Fujita | B60H 1/00007 165/104.12 |
| 6,082,626 A | * | 7/2000 | Morikawa | B60H 1/02 237/12.3 B |
| 2005/0061263 A1 | * | 3/2005 | Lee | F01P 7/167 123/41.1 |

(Continued)

*Primary Examiner* — Daniel Previl
(74) *Attorney, Agent, or Firm* — Ming Chow; Sinorica, LLC

(57) ABSTRACT

A water cooling device includes a radiator provided with a radiating member and connected with a water tank, which is connected with a first pump and a second pump. The first pump and the second pump can be actuated to operate by turns so that the first pump and the second pump can alternately have the cooling liquid in the water tank conveyed to an endothermic water cooling head for cooling off a heating element. The water cooling device of this invention is able to attain effect of continuous operation without interruption.

8 Claims, 2 Drawing Sheets

(51) Int. Cl.
*F28F 27/00* (2006.01)
*F28F 27/02* (2006.01)

(52) U.S. Cl.
CPC ..... *H05K 7/20154* (2013.01); *H05K 7/20263* (2013.01); *H05K 7/20272* (2013.01); *H05K 7/20718* (2013.01); *F28F 2250/06* (2013.01); *F28F 2250/08* (2013.01)

(58) Field of Classification Search
CPC ......... B60W 2510/242; B60W 50/029; B60W 20/50; B60W 30/1886; B60Y 2200/25; B60Y 2200/412; E02F 9/2075; E02F 9/2246; E02F 9/123; E02F 9/2058
USPC ....... 340/449, 440, 450, 450.2, 525, 539.26, 340/618, 636.14, 691.6, 450.1, 450.3, 340/516, 539.27–539.29, 539.3, 568.8, 340/573.6, 588–589, 600–602, 610, 655
See application file for complete search history.

(56) References Cited

U.S. PATENT DOCUMENTS

| | | | |
|---|---|---|---|
| 2009/0107567 A1* | 4/2009 | Crary | E03B 11/02 137/560 |
| 2012/0272927 A1* | 11/2012 | Jonsson | F24D 11/002 122/19.1 |
| 2013/0205824 A1* | 8/2013 | Morimoto | F25B 7/00 62/324.6 |
| 2014/0251309 A1* | 9/2014 | Kuebler | F24D 11/003 126/615 |

\* cited by examiner

WATER COOLING DEVICE

BACKGROUND OF THE INVENTION

1. Field of the Invention

This invention relates to a heat dissipation device, particularly to a water cooling device, which has high reliability and is able to keep on operating and continuously carry out heat dissipation for plural heating elements.

2. Description of the Prior Art

Generally, industrial computers, server computers and high heat emitting elements are mostly operated for 24 hours a day and the servers of computers will produce high heat in operating processes. Although computers are installed therein with cooling fans, yet heat sources of the computer equipment continue to produce, and air convection of the cooling fans installed in the computers is not sufficiently effective and hence effect of heat dissipation is limited. Therefore, for effectively lowering temperature, a water cooling device was developed to be installed on the heating elements of electronic equipment for regulating operative temperature of the servers of computers by making use of cooling liquid to circularly pass through the heating elements continuously.

However, the drawback of the conventional water cooling device is that the conventional cooling device is provided with only one pump and thus, in case that the pump is out of order, operation of the computer will be affected and interrupted. Therefore, having observed foresaid drawback, the inventor of this invention thinks that the conventional water cooling device has to be ameliorated and hence devises this invention.

SUMMARY OF THE INVENTION

The objective of this invention is to off a water cooling device, which is able to be operated for 24 hours a day without stopping running and maintain heat dissipating effect all year round, thus maintaining trustworthiness, stability and reliability of the cooling system.

The water cooling device in the present invention includes a radiator provided with a radiating member and connected with a water tank. The water tank is connected with a first pump and a second pump, which are respectively connected with a first non-return valve and a second non-return valve. A control panel is electrically connected with the first pump and the second pump, and an endothermic water cooling head has one end connected with the first non-return valve and the second non-return valve and another end connected with the radiator, the endothermic water cooling head employed for absorbing heat of heating elements.

The water cooling device of this invention is to have the first pump and the second pump operated continuously or operated alternately to have cooling liquid in the water tank sent out and flowing into the endothermic water cooling head for cooling off the heating elements. After the temperature of the cooling liquid rises, the cooling liquid is gathered to flow into the radiator to carry out heat dissipation and then, the cooling liquid is conveyed to the water tank to carry out cyclic operation. Therefore, the water cooling device of this invention can be operated continuously and can keep on cooling off the heating elements.

BRIEF DESCRIPTION OF DRAWINGS

This invention will be better understood by referring to the accompanying drawings, wherein.

DETAILED DESCRIPTION OF THE PREFERRED EMBODIMENT

Figure 1:
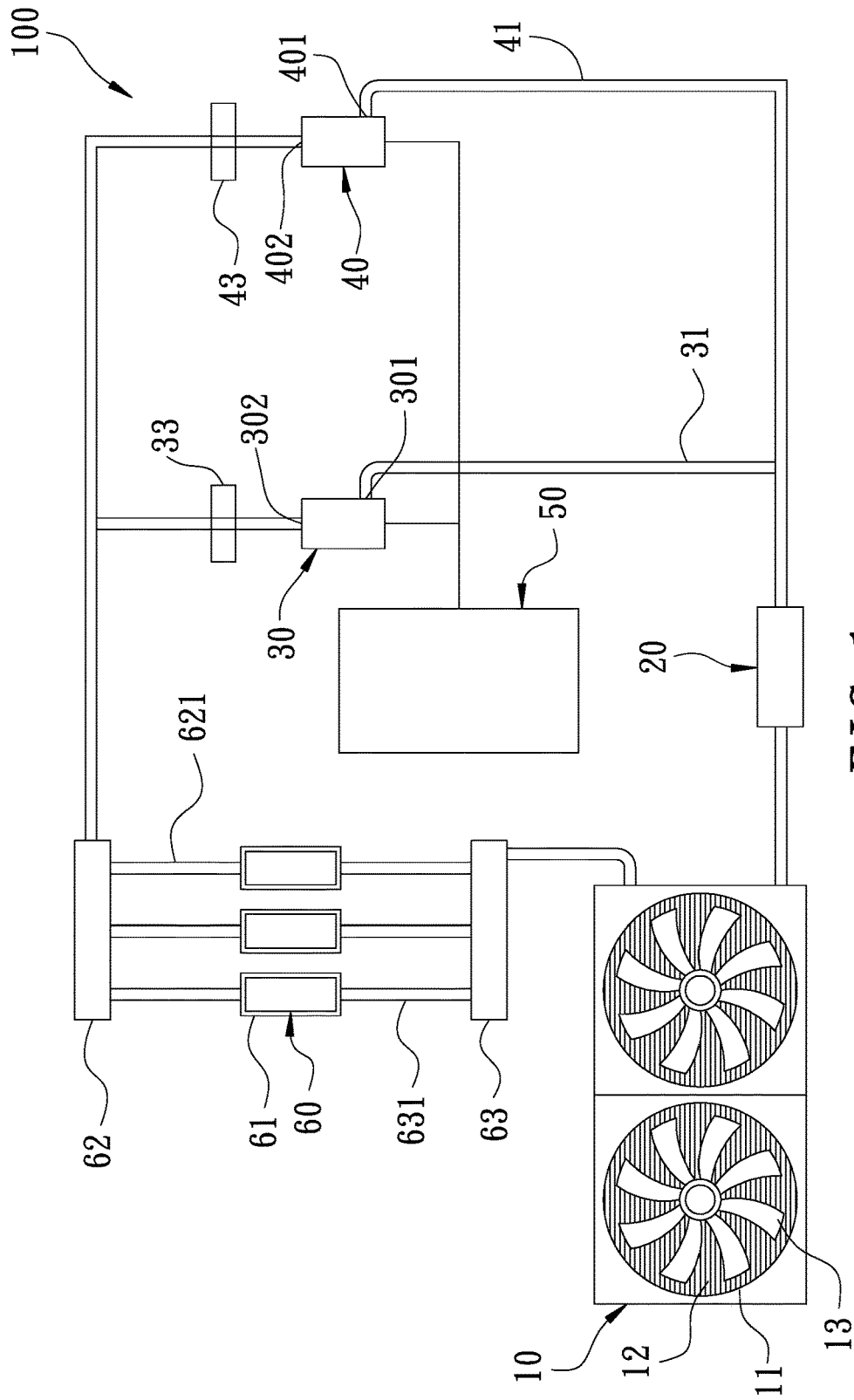
FIG. 1 is a system arrangement diagram of a water cooling device in the present invention.
Figure 2:
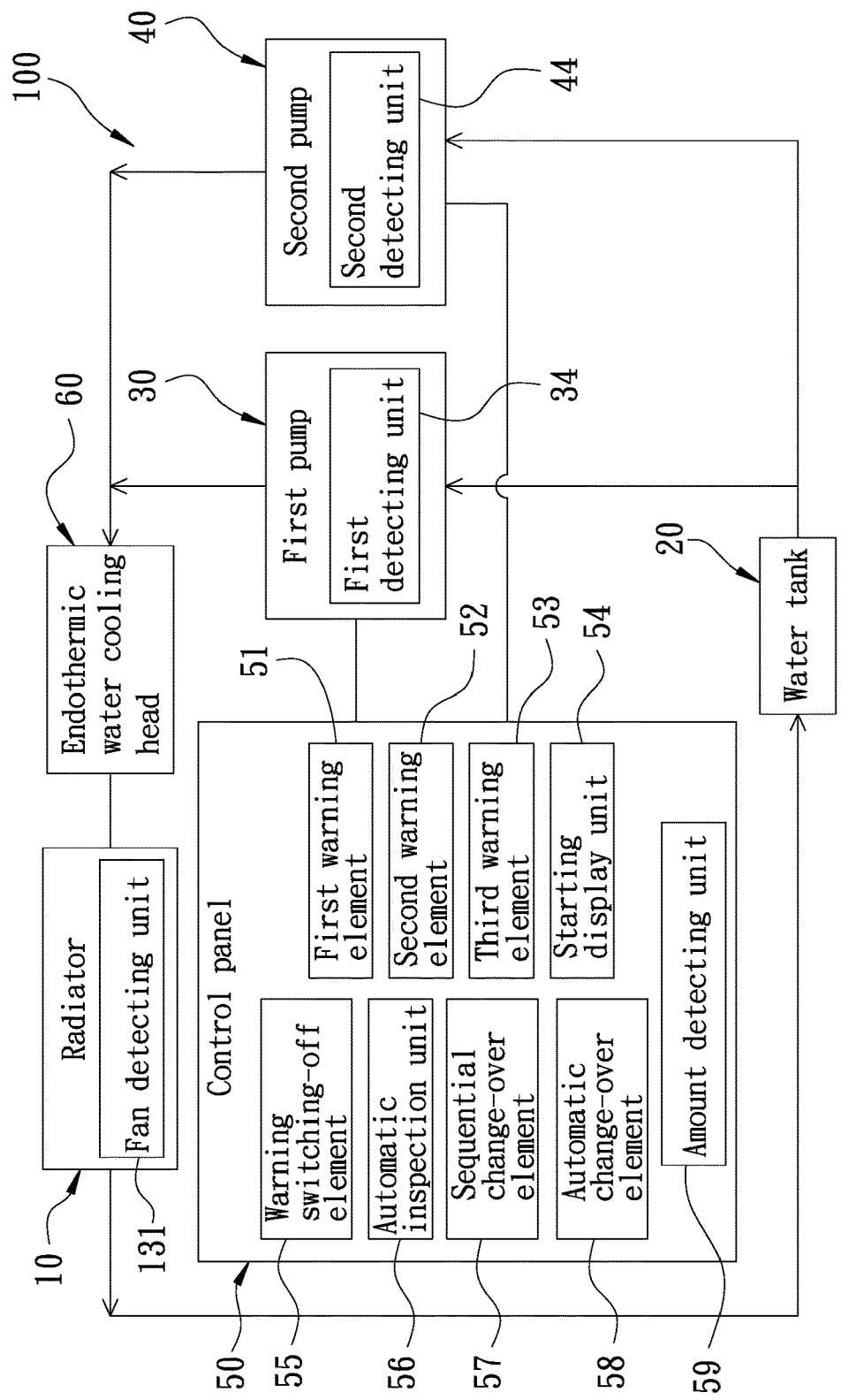
FIG. 2 is a system block diagram of the water cooling device in the present invention.

A preferred embodiment of a water cooling device 100 in the present invention, as shown in FIGS. 1 and 2, includes a radiator 10, a water tank 20, a first pump 30, a second pump 40, a control plate 50 and an endothermic water cooling head 60 as main components combined together.

The radiator 10 is provided with a radiating member 11 containing a radiating fin 12, which has one side provided with at least one fan 13. In this preferred embodiment, the radiating fin 13 has one side installed with two fans 13 respectively disposed with a fan detecting unit 131, and the two fan detecting units 131 can be rotating speed detectors.

The water tank 20 is connected with the radiator 10.

The first pump 30 has its water inlet 301 provided with a first connecting pipe 31 connected with the water tank 20 and its water outlet 302 connected with a first non-return valve 33. The first pump 30 is provided with a first detecting unit 34, which is a rotating speed detector.

The second pump 40 has its water inlet 401 provided with a second connecting pipe 41 connected with the water tank 20 and its water outlet 402 connected with a second non-return valve 43. The second pump 40 is disposed with a second detecting unit 44 that is a rotating speed detector.

The control panel 50 electrically connected with the two fans 13 and both the first pump 30 and the second pump 40 is provided with a first warning element 51, a second warning element 52, a third warning element 53, a starting display unit 54, a warning switching-off element 55, an automatic inspection unit 56, a sequential change-over element 57, an automatic change-over element 58 and an amount detecting unit 59. The first warning element 51, the second warning element 52 and the third warning element 53 can be a light-emitting diode (LED) or a buzzer. The first warning element 51 and the second warning element 52 are respectively and electrically connected with the first detecting unit 34 and the second detecting unit 44, while the third warning element 53 is electrically connected with the fan detecting units 131. The starting display unit 54 is able to display a state that the water cooling device 100 is started. The warning switching-off element 55 is a push button electrically connected with the first warning element 51, the second warning element 52 and the third warning element 53 and used for warning of switching off the first warning element 51, the second warning element 52 and the third warning element 53. The automatic inspection unit 56 can automatically and alternately operate the first pump 30 or the second pump 40 in a first predetermined time when the first pump 30 and the second pump 40 are started, installed or replaced. The sequential change-over element 57 can actuate the first pump 30 and the second pump 40 to operate by turns in a second predetermined time. The automatic change-over element 58 can automatically jump frequency and start the normal first pump 30 or the normal second pump 40 when the first detecting unit 34 and the second detecting unit 44 detect that the first pump 30 or the second pump 40 is operated abnormally. The amount detecting unit 59 is used to detect the amount of the pumps connected for cooperating with the automatic inspection unit 56, the sequential change-over element 57 and the automatic change-over element 58 to carry out automatic inspection, sequential change-over and automatic change-over operation. In this preferred embodiment, the automatic inspection unit 56 can employ a third predetermined time to automatically operate the two fans 13 by turns when the two fans 13 are started, installed or replaced, and the sequential change-over element 57 enables the two fans 13 to carry out alternate operation in a fourth predetermined time. Further, the automatic change-over element 58 will automatically jump frequency and start the normal one of the two fans 13 when the fan detecting units 131 respectively detects that one of the two fans 13 is operated abnormally, and the amount detecting unit 59 can function to detect the amount of the fans connected for cooperating with the automatic inspection unit 56, the sequential change-over element 57 and the automatic change-over element 58 to carry out automatic inspection, sequential change-over and automatic change-over operation.

The endothermic water cooling head 60 has one end connected with the first non-return valve 33 and the second non-return valve 43 and another end connected with the radiator 10, and the endothermic water cooling head 60 is employed for absorbing heat of a heating element 61. The endothermic water cooling head 60 contains a shunt valve 62 having one end connected with the first non-return valve 33 and the second non-return valve 43. The shunt value 62 is to have the cooling liquid of the first non-return valve 33 and the second non-return valve 43 conveyed to the heating element 61 by a plurality of water distributing pipes 621 for cooling off the heating element. The endothermic water cooling head 60 further contains a water collecting valve 63 having one end provided with a plurality of water collecting pipes 631 at the heating element 61. After the temperature of the cooling liquid rises, the cooling liquid will be gathered to the water collecting valve 63 via the water collecting pipes 631 and then flow to the radiator 10 for carrying out heat dissipation.

When the water cooling device 100 of this invention is stated, the starting display unit 54 will shine, and the automatic inspection unit 56 cooperating with the amount detecting unit 59 will automatically and alternately operate the first pump 30 or the second pump 40 in comparatively short first predetermined time for inspecting whether the first pump 30 or the second pump 40 is operated normally and continuously, the sequential change-over element 57 will be started to actuate the first pump 30 and the second pump 40 to carry out operation by turns in comparatively long second predetermined time for enhancing service life of the first pump 30 and the second pump 40. In this preferred embodiment, the first pump 30 is started first to have the cooling liquid in the water tank 20 conveyed out through the first connecting pipe 31 and flowing through the first non-return valve 33 and into the shunt valve 62 and then flowing to the heating element 61 to carry out heat exchange cooling. After the temperature of the cooling liquid rises, the cooling liquid will be actuated to flow to the water collecting valve 63 through the water collecting pipes 631 and then flow into the radiator 10 and simultaneously, the fans 13 in the radiator 10 will blow toward the radiating fin 12 for cooling off the cooling liquid and afterward the cooling liquid is conveyed to the water tank 20, and such a cyclic process is repeated. After the first pump 30 is operated in the second predetermined time, the sequential change-over element 57 will start the second pump 40 and turn off the first pump 30. At this time, the second pump 40 will have the cooling liquid in the water tank 20 sent out through the second connecting pipe 41 and flowing through the second non-return valve 43 and into the endothermic water cooling head 60 and subsequently, the cooling liquid is collected to the radiator 10 to be cooled off and then once more flows back to the water tank 20 and lastly, the sequential change-over element 57 will start the first pump 30 and switch off the second pump 40, and this cyclic process is repeated. By so designing, the first pump 30 and the second pump 40 can be operated alternately by the sequential change-over element 57 cooperating with the amount detecting unit 59, thus tallying with requirement that industrial computers and server computers can be operated all day and all year round without stopping running and able to continuously offer and maintain heat dissipation effect and hence prolonging period of service and maintaining trustworthiness, stability and reliability of the cooling system.

The first pump 30 and the second pump 40 are respectively provided with the first detecting unit 34 and the second detecting unit 44 for respectively detecting the rotating speed of the first pump 30 and the second pump 40. Therefore, when the first detecting unit 34 or the second detecting unit 44 detects that the first pump 30 or the second pump 40 is operated abnormally, the first warning element 51 or the second warning element 52 will shine or give out warning sounds and at this time, the automatic change-out element 58 will automatically jump frequency and start the normal first pump 30 or the normal second pump 40 to enable the water cooling device 100 to operate continuously. Meanwhile, operators can first turn off the first warning element 51 and the second warning element 52 via the warning switching-off element 55 and then have the abnormal first pump 30 or the abnormal second pump 40 replaced and the replacing process is easy and simple. In the process of replacement, since the water cooling device 100 is provided with the first non-return valve 33 and the second non-return valve 43; therefore, the water cooling device 100 can keep on operating, needless to stop running. After finishing replacement of the pump, the automatic inspection unit 56 will automatically and alternately operate the first pump 30 or the second pump 40 in a first predetermined time for inspecting whether the replaced first pump 30 or the replaced second pump 40 can be operated normally or not and lastly, the normal water cooling procedure is restored.

In this preferred embodiment, the control panel 50 is electrically connected with the two fans 13, which are respectively provided with the fan detecting unit 131. Thus, when the water cooling device 100 is started, the automatic inspection unit 56 cooperating with the amount detecting unit 59 will automatically operate the two fans 13 by turns in the third predetermined time for inspecting whether the two fans 13 are operated normally, and continuously will start the sequential change-over element 57 to operate the two fans 13 alternately in the fourth predetermined time. When the fan detecting units 131 detect that one of the two fans 13 is operated abnormally, the third warning element 53 will shine or give out warning sounds and at this time, the automatic change-over element 58 will automatically jump frequency to the normal one of the two fans 13 to enable the radiator 10 to keep on operating, while the operators can first switch off the third warning element 53 via the warning switching-off element 55 and then have the abnormal fan 13 replaced and the replacing process is easy and simple. In the process of replacement, the water cooling device 100 is able to keep on running and needless to stop operating and after finishing replacement, the automatic inspection unit 56 will automatically operate the fans 13 alternately in the third predetermined time for inspecting whether the replaced fan 13 is operated normally and lastly, the water cooling procedure is restored. By so designing, the water cooling device 100 of this invention can meet needs of operating all day without stopping running and operating all year round, thus able to prolong duration of service and maintain trustworthiness, stability and reliability of the cooling system.

What is worthy of mentioning is that the control panel 50 is installed with the amount detecting unit 59 for detecting amount of the pumps connected and the fans connected and displaying the amount of the pumps and the fans on the control panel 50. Therefore, operators can depend on the amount of the pumps and the fans displayed on the control panel 50 cooperating with the automatic inspection unit 56, the sequential change-over element 57 and the automatic change-over element 58 to carry out automatic inspection, sequential change-over and automatic change-over operation.

The water cooling device 100 of this invention is to have the first pump 30 and the second pump 40 operated by turns to alternately have the cooling liquid in the water tank 20 conveyed into the heating element 61 for cooling off the heating element 61; therefore, the cooling system can be operated continuously without interruption.

While the preferred embodiment of the invention has been described above, it will be recognized and understood that various modifications may be made therein and the appended claims are intended to cover all such modifications that may fall within the spirit and scope of the invention.

What is claimed is:

1. A water cooling device comprising:
   a radiator provided with a radiating member, said radiating member comprising a radiating fin, said radiating fin having one side installed with a fan;
   a water tank connected with said radiator;
   a first pump having a water inlet provided with a first connecting pipe, said first connecting pipe connected with said water tank, said first pump having a water outlet connected with a first non-return valve;
   a second pump having a water inlet provided with a second connecting pipe, said second connecting pipe connected with said water tank, said second pump having a water outlet provided with a second non-return valve;
   a control panel electrically connected with said fan and said first pump and said second pump;
   an endothermic water cooling head having one end connected with both said first non-return valve and said second non-return valve and another end connected with said radiator, said endothermic water cooling head employed for absorbing heat of a heating element;
   said first pump and said second pump being respectively disposed with a first detecting unit and a second detecting unit, said first detecting unit and said second detecting unit being respectively and electrically connected with a first warning element and a second warning element of said control panel;
   said radiating fin having one side provided with two fans, said two fans being respectively mounted with a fan detecting unit, said fan detecting units being electrically connected with a third warning element of said control panel; and
   said control panel being set with an automatic change-over element, said automatic change-over element being able to automatically jump frequency and start normal said first pump or normal said second pump when said first detecting unit and said second detecting unit respectively detect that said first pump or said second pump is operated abnormally, further, said automatic change-over element being able to automatically jump frequency and start a normal one of said two fans when said fan detecting unit detects that one of said two fans is operated abnormally.

2. The water cooling device as claimed in claim 1, wherein said first warning element and said second warning element being an LED (light-emitting diode) or a buzzer.

3. The water cooling device as claimed in claim 1, wherein said control panel is provided with a starting display unit, said starting display unit being an LED.

4. The water cooling device as claimed in claim 1, wherein said control panel is provided with a warning switching-off element, said warning switching-off element electrically connected with said first warning element and said second warning element and said third warning element, said warning switching-off element employed for turning off warning of said first warning element and said second warning element and said third warning element.

5. The water cooling device as claimed in claim 1, wherein said control panel is disposed with an automatic inspection unit, said automatic inspection unit able to automatically and alternately operate said first pump and said second pump in a first predetermined time for inspecting said first pump and said second pump when said first pump and said second pump are started, installed or replaced, said automatic inspection unit also able to employ a third predetermined time to automatically and alternately operate said two fans for inspecting said two fans when said two fans are started, installed or replaced.

6. The water cooling device as claimed in claim 1, wherein said control panel is provided with a sequential change-over element, said sequential change-over element able to actuate said first pump and said second pump to operate by turns in a second predetermined time, said sequential change-over element also able to actuate said two fans to operate alternately in a fourth predetermined time.

7. The water cooling device as claimed in claim 1, wherein said control panel is provided with an amount detecting unit for detecting amount of pumps connected and fans connected.

8. The water cooling device as claimed in claim 1, wherein said endothermic water cooling head contains a shunt valve, said shunt valve having one end connected with said first non-return valve and said second non-return valve, said shunt valve having the cooling liquid of said first non-return valve and said second non-return valve respectively conveyed to said heating element by means of plural water distributing pipes, said endothermic water cooling head further including a water collecting valve, said water collecting valve having one end provided with plural water collecting pipes at said heating element, said water collecting pipes having the cooling liquid gathered to said water collecting valve and then flowing to said radiator after the temperature of the cooling liquid rises.

\* \* \* \* \*